United States Patent
Kobayashi et al.

(10) Patent No.: US 8,865,580 B2
(45) Date of Patent: Oct. 21, 2014

(54) PATTERN FORMING METHOD, SEMICONDUCTOR DEVICE MANUFACTURING METHOD, AND COATING APPARATUS

(75) Inventors: Katsutoshi Kobayashi, Hachioji (JP); Daisuke Kawamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 13/603,902

(22) Filed: Sep. 5, 2012

(65) Prior Publication Data

US 2013/0217217 A1 Aug. 22, 2013

(30) Foreign Application Priority Data

Feb. 22, 2012 (JP) ................................. 2012-036375

(51) Int. Cl.
*H01L 21/3205* (2006.01)
*H01L 21/4763* (2006.01)

(52) U.S. Cl.
USPC .......................................... 438/587; 438/585

(58) Field of Classification Search
USPC ........................................................ 438/587
See application file for complete search history.

(56) References Cited

U.S. PATENT DOCUMENTS

| | | | | |
|---|---|---|---|---|
| 5,554,486 | A * | 9/1996 | Garza | 430/273.1 |
| 6,171,937 | B1 * | 1/2001 | Lustig | 438/585 |
| 6,171,938 | B1 * | 1/2001 | Lee et al. | 438/585 |
| 6,239,008 | B1 * | 5/2001 | Yu et al. | 438/587 |
| 6,329,251 | B1 * | 12/2001 | Wu | 438/275 |
| 7,858,479 | B2 | 12/2010 | Mizuno et al. | |
| 2001/0051418 | A1 * | 12/2001 | Otsuki | 438/587 |
| 2003/0215749 | A1 * | 11/2003 | Kato et al. | 430/296 |
| 2004/0265745 | A1 * | 12/2004 | Sho et al. | 430/311 |
| 2005/0158959 | A1 * | 7/2005 | Doyle | 438/303 |
| 2005/0214695 | A1 * | 9/2005 | Kato et al. | 430/324 |
| 2005/0215040 | A1 * | 9/2005 | Doyle | 438/585 |
| 2006/0148226 | A1 * | 7/2006 | Kim | 438/585 |
| 2010/0081091 | A1 * | 4/2010 | Hashimoto et al. | 430/311 |
| 2011/0003469 | A1 * | 1/2011 | Kewley et al. | 438/591 |
| 2011/0111593 | A1 | 5/2011 | Kanno | |
| 2012/0021594 | A1 * | 1/2012 | Gurtej et al. | 438/585 |
| 2012/0156866 | A1 * | 6/2012 | Ahn | 438/585 |
| 2013/0095626 | A1 * | 4/2013 | Sasaki | 438/270 |

FOREIGN PATENT DOCUMENTS

| | | |
|---|---|---|
| JP | 2003-154304 | 5/2003 |
| JP | 2004-008906 | 1/2004 |
| JP | 2004-273586 | 9/2004 |
| JP | 2007-189153 | 7/2007 |
| JP | 2011-100922 | 5/2011 |
| WO | WO 2005/112088 A1 | 11/2005 |

* cited by examiner

*Primary Examiner* — Yu-Hsi D Sun
*Assistant Examiner* — Grant Withers
(74) *Attorney, Agent, or Firm* — Finnegan, Henderson, Farabow, Garrett & Dunner, LLP

(57) ABSTRACT

According to one embodiment, a pattern forming method is disclosed. A resist pattern having a top surface is formed pattern on a substrate. A coating film having a first thickness distribution is formed on the substrate. The coating film covers the resist pattern. The coating film is thinned to expose the top surface of the resist pattern. The first thickness distribution is changed into a second thickness distribution which is more uniform than the first thickness distribution. The resist pattern is removed without removing the coating film. A pattern is formed in the substrate by processing the substrate by using the coating film as a mask.

15 Claims, 6 Drawing Sheets

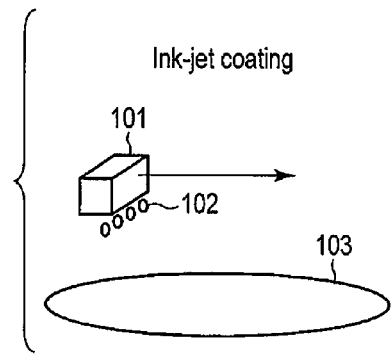
F I G. 10A
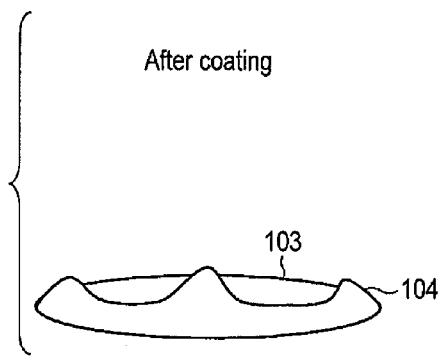
F I G. 10B
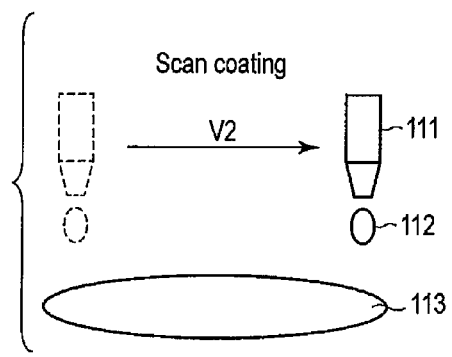
F I G. 11A
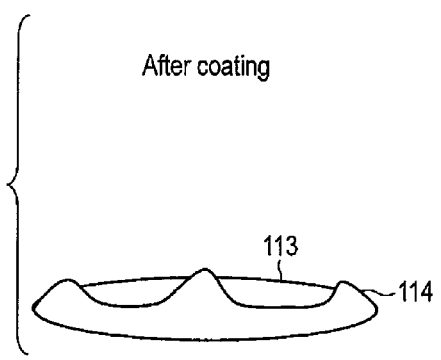
F I G. 11B
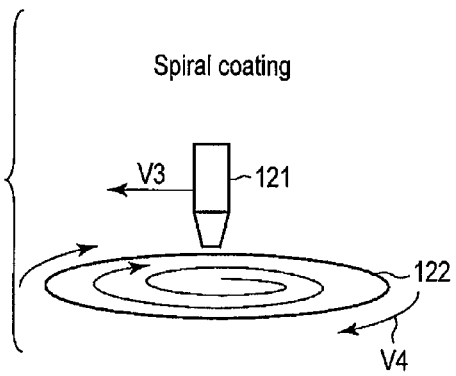
F I G. 12A
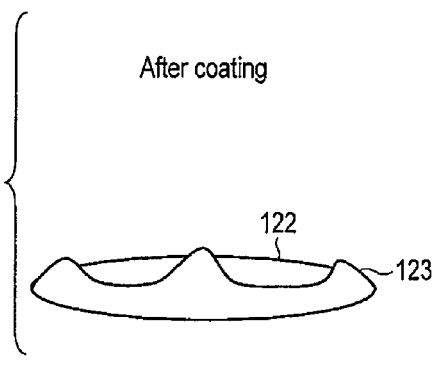
F I G. 12B

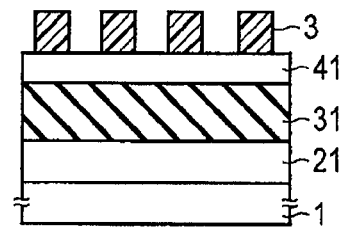
F I G. 13
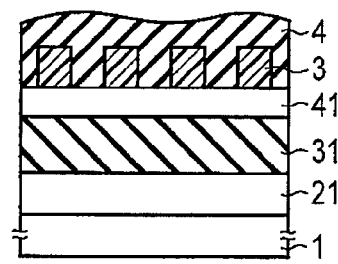
F I G. 14
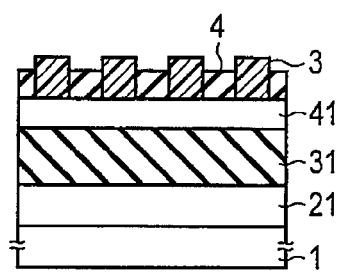
F I G. 15
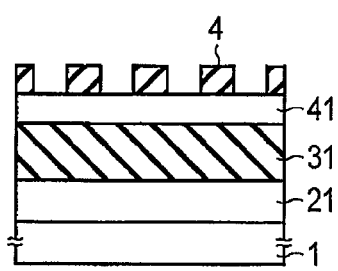
F I G. 16

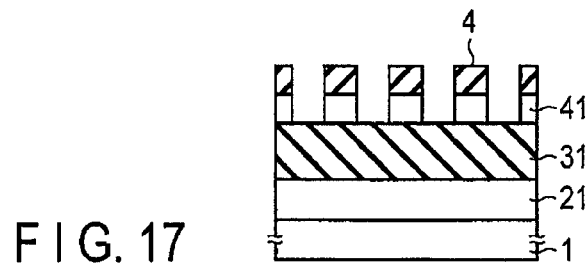
F I G. 17
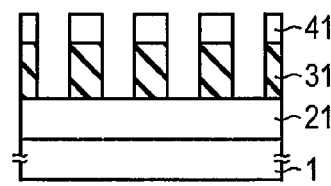
F I G. 18
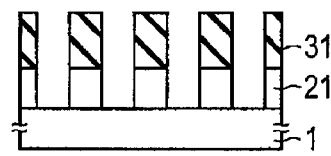
F I G. 19
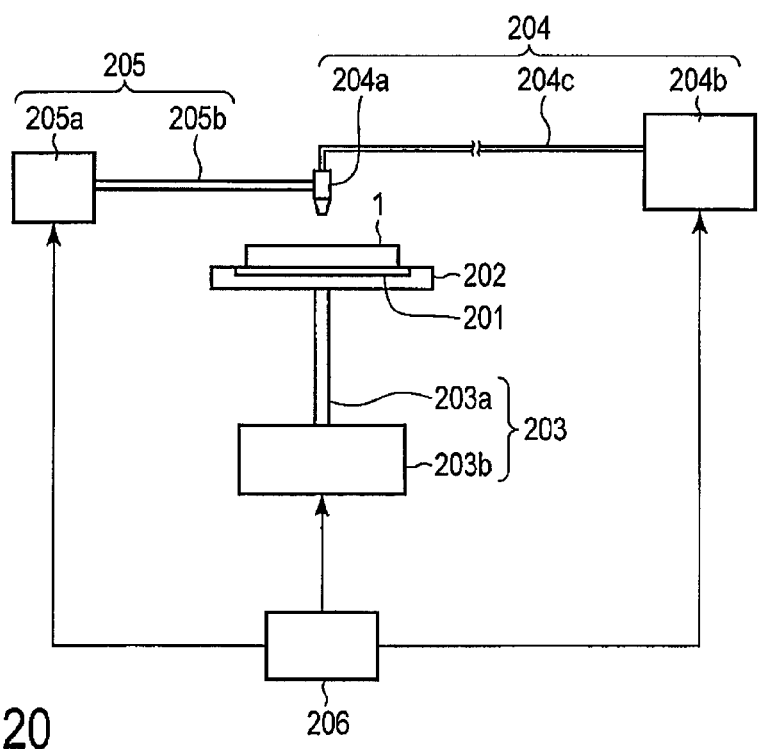
F I G. 20

PATTERN FORMING METHOD, SEMICONDUCTOR DEVICE MANUFACTURING METHOD, AND COATING APPARATUS

CROSS-REFERENCE TO RELATED APPLICATIONS

This application is based upon and claims the benefit of priority from Japanese Patent Application No. 2012-036375, filed Feb. 22, 2012, the entire contents of which are incorporated herein by reference.

FIELD

Embodiments described herein relate generally to a pattern forming method used for manufacturing a semiconductor device, a semiconductor device manufacturing method, and a coating apparatus.

BACKGROUND

A semiconductor device manufacturing method generally includes the step of forming a resist pattern on a workpiece substrate including a semiconductor substrate and the step of etching the workpiece substrate by using the resist pattern as a mask to form a micropattern. The step of forming the resist pattern and the step of etching the workpiece substrate are repeated to form a necessary pattern, thereby manufacturing a semiconductor device.

However, the progress of pattern miniaturization causes a difficulty in forming a fine pattern having both desired shape and dimensions even if etching the workpiece substrate by using the resist pattern as a mask.

BRIEF DESCRIPTION OF THE DRAWINGS

FIGS. 10A and 10B are diagrams to explain an example of forming a coating film by ink-jet coating method;

FIGS. 11A and 11B are diagrams to explain an example of forming a coating film by scan coating method;

FIGS. 12A and 12B are diagrams to explain an example of forming a coating film by spiral coating method;

FIG. 13 is a sectional view to explain a pattern forming method according to a second embodiment;

FIG. 14 is a sectional view to explain the pattern forming method of the second embodiment following FIG. 13;

FIG. 15 is a sectional view to explain the pattern forming method of the second embodiment following FIG. 14;

FIG. 16 is a sectional view to explain the pattern forming method of the second embodiment following FIG. 15;

FIG. 17 is a sectional view to explain the pattern forming method of the second embodiment following FIG. 16;

FIG. 18 is a sectional view to explain the pattern forming method of the second embodiment following FIG. 17;

FIG. 19 is a sectional view to explain the pattern forming method of the second embodiment following FIG. 18; and FIG. 20 is a diagram schematically showing a coating apparatus according to an embodiment.

DETAILED DESCRIPTION

Figure 1:
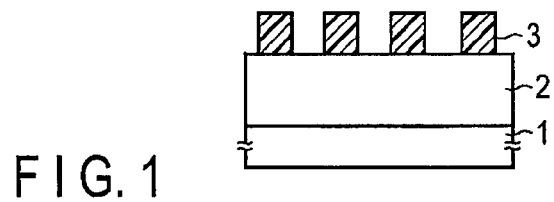
FIG. 1 is a sectional view to explain a pattern forming method according to a first embodiment.

Hereinafter, embodiments will be explained with reference to the accompanying drawings.

In general, according to one embodiment, a pattern forming method is disclosed. The pattern forming method includes forming a resist pattern on a substrate. The resist pattern has a top surface. A coating film is formed on the substrate. The coating film is configured to cover the resist pattern. The coating film has a first thickness distribution. The coating film is thinned to expose the top surface of the resist pattern. The first thickness distribution is changed into a second thickness distribution when the coating film is thinned. Here, the second thickness distribution is more uniform than the first thickness distribution. The resist pattern is removed without removing the coating film. A pattern is formed in the substrate by processing the substrate by using the coating film after the removing the resist pattern as a mask.

According to one embodiment, a semiconductor device manufacturing method is disclosed. The semiconductor device manufacturing method includes preparing a substrate, and forming a plurality of line and space patterns on the substrate. The plurality of line & space patterns are equal in heighty and being different in half pitch. The plurality of line & space patterns includes at least one line & space pattern having a half pitch not higher than a certain value. The at least one line & space pattern is formed by a pattern forming method according to the embodiment.

According to one embodiment, a coating apparatus is disclosed. The coating apparatus includes a holding unit configured to hold a substrate on which a coating film is to be formed, a rotating unit configured to rotate the substrate held by the holding unit, a discharging unit comprising a nozzle from which coating solution is discharged toward the substrate held by the holding unit, a moving unit configured to move the nozzle in a radial direction of the substrate held by the holding unit. The coating apparatus further includes a controlling unit configured to control at least one of spin speed of the substrate rotated by the rotating unit, amount of coating solution discharged from the nozzle of the discharging unit, and moving speed of the nozzle moved by the moving unit, to form a coating film having a desired thickness distribution on the substrate.

First Embodiment

FIGS. 1 to 5 are sectional views to explain a pattern forming method according to a first embodiment.

[FIG. 1]

First, a workpiece film 2 is formed on a silicon substrate 1. In the present embodiment, the silicon substrate 1 and workpiece film 2 are collectively called a substrate. The workpiece film 2 is, for example, an insulating film such as a silicon oxide film, or a semiconductor film such as a polycrystalline silicon film. Next, a resist pattern 3 is formed on the workpiece film 2. The resist pattern 3 is formed by, for example, optical lithographic process or an imprint lithographic process.

[FIG. 2]

A coating film 4 having a certain thickness distribution and covering the resist pattern 3 is formed on the substrate by coating method. The certain thickness distribution is not uniform. The certain thickness distribution will be explained later.

[FIG. 3]

The top surface of the resist pattern 3 is exposed by thinning the coating film 4 by etch back. The etch back is performed by using, for example, Reactive Ion Etching (RIE) process. In the present embodiment, side surfaces of the upper portions of the resist pattern 3 are also exposed. In place of the RIE process, Chemical Mechanical Polishing (CMP) process may be used.

Here, the certain thickness distribution is selected so as to cancel a distribution of thickness decrement of the coating film caused by the thinning the coating film by etch back.

Figure 6:
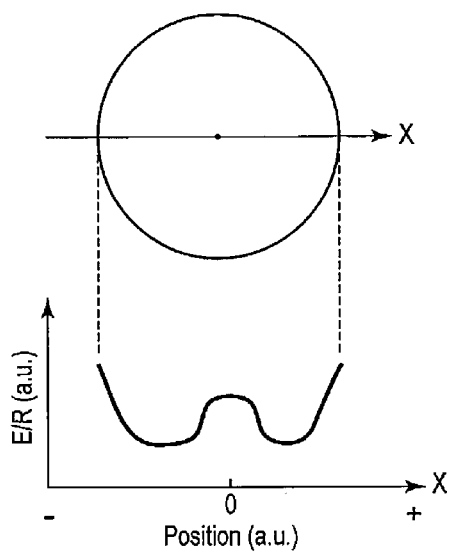
FIG. 6 shows a distribution of etching rates of a coating film in a plane of substrate.

The reason for decreasing of the thickness due to the etch back is that the etching rate (E/R) of the coating film 4 in the surface of the substrate varies with position (X) as shown in FIG. 6. X is a horizontal axis passing through the center of in-plane surface of the substrate. FIG. 6 shows an example in the horizontal direction, but a similar distribution to that of FIG. 6 is obtained with respect to the axis passing through the center of in-plane surface of the substrate. This is because the etching rate principally varies from the center of in-plane surface of the substrate toward the outer edge.

Such an etching rate variation of the coating film over in-plane surface of the substrate may change depending on etching conditions. In the case of RIE, the etching rate may change with, for example, gas mixing ratio, gas flow rate, or applied voltage.

Figure 7:
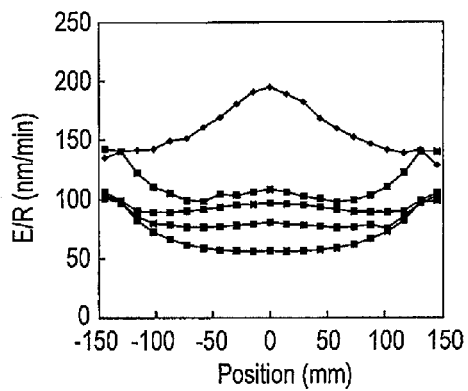
FIG. 7 shows a distribution of variations in the etching rate of the coating film in a plane of substrate obtained by changing etching conditions.

FIG. 7 shows a distribution of variations in the etching rate of the coating film in the plane of substrate obtained by changing etching conditions. The etching rate was calculated based on etching time, and the difference between the thickness of the coating film before etching and thickness of the coating film after etching. The thickness of the coating film after etching can be obtained using, for example, an ellipsometer.

As seen from FIG. 7, there are the following distributions: a distribution (the top distribution) where the etching rate decreases from the middle (X=0) toward the outer edge, a distribution (the second distribution from the top) where the etching rate decreases from the middle (X=0) halfway toward the outer edge, then increases, and decreases again toward the outer edge, distributions (the third and fourth distributions from the top) where the etching rate decreases from the middle (X=0) halfway toward the outer edge, then increases, and reaches the peak at the outer edge, and a distribution (the bottom distribution) where the etching rate increases from the middle (X=0) toward the outer edge.

Figure 2:
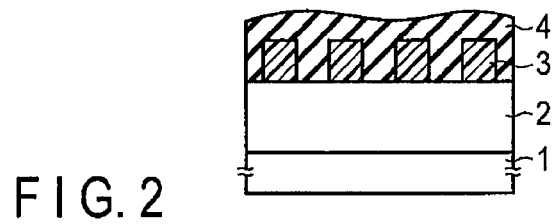
FIG. 2 is a sectional view to explain the pattern forming method of the first embodiment following FIG. 1.
Figure 3:
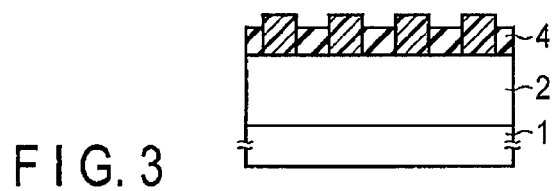
FIG. 3 is a sectional view to explain the pattern forming method of the first embodiment following FIG. 2.
Figure 4:
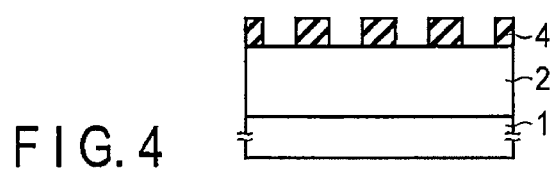
FIG. 4 is a sectional view to explain the pattern forming method of the first embodiment following FIG. 3.
Figure 5:
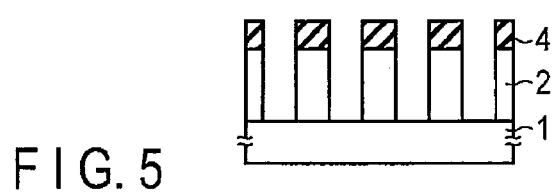
FIG. 5 is a sectional view to explain the pattern forming method of the first embodiment following FIG. 4.

In the present embodiment, the thickness distribution of the coating film 4 in the step of FIG. 2 is determined, taking into account of the distribution of thickness decrement of the coating film due to the etch back. That is, the coating film 4 is made thicker in a portion where the amount of thickness decrement to the etch back is larger, whereas the coating film 4 is made thinner in a portion where the amount of thickness decrement due to the etch back is smaller (FIG. 2), thereby the thickness of the coating film 4 after the etch back is made as uniform as possible over the in-plane of the substrate (FIG. 3).

[FIG. 4]

The resist pattern 3 is selectively removed with respect to the coating film 4. The resist pattern 3 is removed by, for example, carbonization process. The coating film (coating film pattern) 4 remained after the removal of the resist pattern 3 has a reversal pattern of the resist pattern 3. The coating film pattern 4 has a uniform thickness over the in-plane surface of the substrate.

[FIG. 5]

A pattern comprising the workpiece film 2 is formed by etching the workpiece film 2 by using the coating film pattern 4 as a mask. When the workpiece film 2 is a semiconductor film such as a polycrystalline silicon film, for example, a gate pattern (gate electrode) is formed. When the workpiece film 2 is an insulating film, for example, a contact hole pattern is formed. The conventional method has a difficulty in forming a fine pattern having a half pitch of 20 nm or less, but the method of the present embodiment may easily form the fine pattern having the half pitch of 20 nm or less, The reason for employing the process (reversal process), where the workpiece film 2 is etched by using the resist pattern 3 instead of resist pattern 3 as a mask, is as follows.

Figure 8:
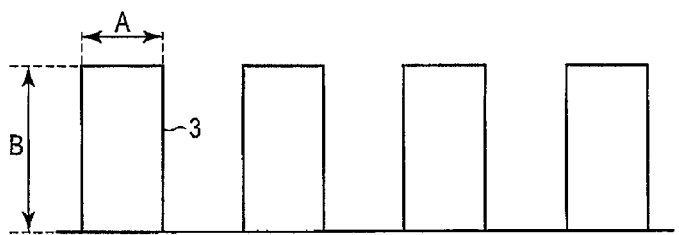
FIG. 8 is a diagram to explain an aspect of a line & space pattern.

In the present process, as shown in FIG. 8, the aspect ratio (=B/A) of the resist pattern 3 for a line & space pattern is low. Its value is, for example, 2.5. Here, A indicates the width of the resist pattern 3, and B indicates the thickness (height) of the resist pattern 3.

The width A narrows as the shrinkage of pattern advances. Since the aspect ratio is fixed, the thickness B decreases in accordance with decreasing of the width A. Therefore, as the miniaturization progresses, the resist pattern 3 becomes thinner. When the workpiece film 2 is etched by using the thin resist pattern 3, the resist pattern 3 disappears during the etching, and then the workpiece film 2 may not be processed into a pattern having predetermined shape and dimensions. Such a problem becomes more significant when it is difficult to ensure the etching selectivity between the resist pattern 3 and the workpiece film 2.

In contrast, when the workpiece film 2 is etched by using the coating film pattern 4 as a mask, the etching rate of coating film pattern 4 to the workpiece film 2 can be generally set lower compared to the resist by appropriately selecting the material of the coating film pattern 4.

However, in a case where the resist pattern 3 has a variation in the thickness, the thin portion of the resist pattern disappears during etching of the workpiece film 2, which may result in a similar problem as the case of using the resist pattern. In addition, the variation of the thickness of the coating film pattern 4 may cause difficulty in forming the pattern having the shape and dimensions in accordance with design even if a part of the coating film pattern 4 does not disappear.

Therefore, in the present embodiment, the problem due to the variation of thickness of the coating film pattern 4 is forestalled by forming the coating film 4 in the step of FIG. 2 where the coating film 4 has the thickness distribution that cancels the distribution of thickness decrement of the coating film which arises in the etch back step of FIG. 3. Thereby, according to the present embodiment, the advantage of reversal process is obtained, which result in providing a pattern forming method capable of dealing with further pattern miniaturization in the future.

Next, a method of forming the coating film having a certain thickness distribution will be explained.

First, the distribution of thickness decrement of the coating film (thickness loss distribution) is prepared where the thickness loss distribution is caused by thinning the coating film pattern by etching back. Since the thickness loss distribution may differ depending on etching conditions (e.g., conditions of RIE), the thickness loss distribution is prepared for each of the etch back conditions used for reversal process.

Next, the step of forming the coating film pattern 4 shown in FIG. 2, wherein the coating film pattern 4 shown is made to have a thickness distribution (thickness correction distribution) capable of cancelling the thickness loss distribution by controlling the formation condition of coating method.

Figure 9A:
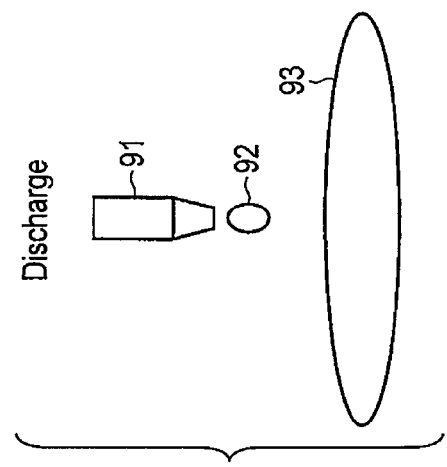
FIGS. 9A, 9B, and 9C are diagrams to explain an example of forming a coating film by spin coating method.
Figure 9B:
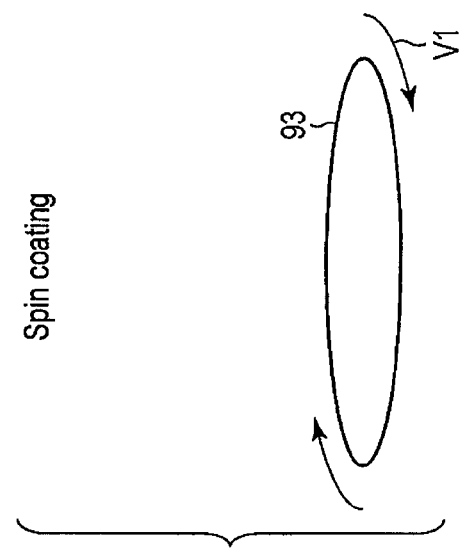
Figure 9C:
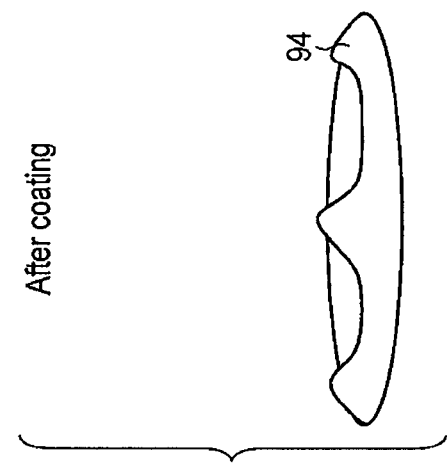

For example, when the coating film is formed by spin-coating method, as shown in FIG. 9C, the coating film 94 having the thickness correction distribution can be formed by controlling at least one of amount of coating solution 92 discharged (dropped) from a nozzle 91 toward a substrate 93 (discharge rate) as shown in FIG. 9A, and spin speed V1 [rpm] of the substrate 93 as shown in FIG. 9B, for example, spinning the substrate 93 at the pin speed V1=2000 [rpm], causing the coating solution to spread widely over the substrate 93.

When the coating film is formed by ink-jet coating method, as shown in FIG. 10B, the coating film 104 having the thickness correction distribution can be formed by controlling, as shown in FIG. 10A, at least one of number of droplets 102 per unit area on the substrate 103 in which the droplets 102 are discharged from a ink-jet head 101 toward the substrate 103 and amount of one droplet 102 discharged from the ink-jet head 101 toward the substrate 103. In general, the thickness of the coating film on a region becomes thicker as the number of droplets per unit area on the region increases, or as the amount of one droplet on the region increases. The amount of droplets per unit area is controlled by changing the number of droplets per unit area while the amount of one droplet is constant. Conversely, the amount of droplets per unit area is also controlled by changing the amount of one droplet while the amount of droplets per unit area is constant.

When the coating film is formed by scan coating method, as shown in FIG. 11B, the coating film 114 having the thickness correction distribution can be formed on the substrate 113 by controlling, as shown in FIG. 11A, at least one of amount of coating solution 112 discharged from a nozzle 11 toward the substrate (discharge rate), and scan speed V2 of the nozzle 111. In general, the thickness of the coating film on a region becomes thicker as the discharge rate on the region increases, or as the scan speed V2 on the region decreases.

When a coating film is formed by spiral coating method, as shown in FIG. 12B, the coating film 114 having the thickness correction distribution can be formed by controlling, as shown in FIG. 12A, at least one of amount of coating solution discharged from a nozzle 121 toward the substrate (discharge rate), moving speed V3 of the nozzle 121 from a center of the substrate 122 toward outer edge of the substrate 122, and spin speed V4 of the substrate 122. In general, the thickness of the coating film on a region becomes thicker as the discharge rate on the region increases, or as the scan and moving speeds V3, V4 on the region decreases.

Second Embodiment

FIGS. 13 to 19 are sectional views to explain a pattern forming method according to a second embodiment. In the following figures, the portions corresponding to the portions shown in the previously mentioned figures are denoted by the same reference numerals and omitted its detail explanation.

[FIG. 13]

First, a polycrystalline silicon film (a first semiconductor film) 21 is formed on a silicon substrate 1. Next, a silicon oxide film (an insulating film) 31 is formed on the polycrystalline silicon film 21. Then, an amorphous silicon film (a second semiconductor film) 41 is formed on the silicon film 31. In the present embodiment, the silicon substrate 1, polycrystalline silicon film 21, silicon oxide film 31, and amorphous silicon film (a-Si film) 41 are collectively called a substrate. Next, a resist pattern 3 is formed on the a-Si film 41.

[FIG. 14]

A coating film 4 having a certain thickness distribution and covering the resist pattern 3 is formed on the substrate by coating method.

[FIG. 15]

The coating film 4 is thinned by etch back, causing the top surface of the resist pattern 3 to be exposed. The thickness distribution of the coating film 4 after the etch back is almost uniform.

[FIG. 16]

The resist pattern 3 is selectively removed with respect to from the coating film 4. The coating film (coating film pattern) 4 remained after the removal of the resist pattern 3 has a reversal pattern of the resist pattern 3, and the coating film pattern 4 has a uniform thickness over the in-plane surface of the substrate.

[FIG. 17]

the coating film pattern 4 is transferred to the a-Si film 41 by etching the a-Si film 41 by using the coating film pattern 4 as a mask. Hereinafter, the a-Si film 41 having the pattern transferred is called an a-Si film pattern 41.

[FIG. 18]

The a-Si film pattern 41 is transferred to the silicon oxide film 31 by etching the a-Si film pattern 41 by using the coating film pattern 4 and a-Si film pattern 41 as a mask, or by using the a-Si film pattern 41 remained after the removal of the coating film pattern 4 as a mask. Hereinafter, the silicon oxide film 31 having transferred the silicon oxide film pattern 31 is called a silicon oxide film pattern 31.

When the coating film pattern 4 and a-Si film 41 are used as a mask, the coating film pattern 4 disappears in the middle of etching the silicon oxide film 31. This is because the coating film pattern 4 and silicon oxide film 31 are both insulating films and therefore a sufficient etching selectivity is not ensured. After the coating film pattern 4 has disappeared, the etching of the silicon oxide film 31 progresses by using the a-Si film 41 as a mask.

[FIG. 19]

The silicon oxide film pattern 31 is transferred to the polycrystalline silicon film 21 by etching the polycrystalline silicon film 21 by using the a-Si film pattern 41 and silicon oxide film pattern 31 as a mask, or by using the silicon oxide film pattern 31 remained after the removal of the a-Si film 41 as a mask.

When the a-Si film pattern 41 and silicon oxide film pattern 31 are used a mask, the a-Si film pattern 41 disappears in the middle of etching the polycrystalline silicon film 21. This is because both of the a-Si film pattern 41 and polycrystalline silicon film 21 are silicon films and therefore the etching selectivity of them is not ensured. After the a-Si film pattern 41 has disappeared, the etching of the polycrystalline silicon film 21 progresses by using the silicon oxide film pattern 31 as a mask.

Thereafter, the silicon oxide film pattern 31 is removed, then a device pattern formed of the polycrystalline silicon film 21 is obtained. This device pattern is, for example, a gate pattern (gate electrode).

According to the present embodiment, the advantage of reversal process is obtained, same as the first embodiment, which result in providing a pattern forming method capable of dealing with further pattern miniaturization in the future.

Further, in the present embodiment, the polycrystalline silicon film 21 is not directly etched by using the coating film pattern 4 as a mask, in which the coating film pattern 4 is obtained by the reversal process. According to the present embodiment, the mask is effectively suppressed from being disappeared in the middle of etching because the polycrystalline silicon film 21 is eventually etched by using the mask of the silicon oxide film pattern 31 that is thicker than the coating film pattern 4.

Furthermore, in the present embodiment, the silicon oxide film is etched by using the mask of a-Si film pattern 41 that has a sufficient etching selectivity to silicon oxide.

Additionally, a pattern of film including carbon (C) may be used instead of the a-Si film pattern 41. Moreover, an insulating film pattern including silicon nitride, or an insulating film pattern including silicon nitride and silicon oxide may be used instead of the silicon oxide film pattern 31.

Furthermore, the pattern forming method of the first or second embodiment is applicable to a semiconductor device manufacturing method. That is, in a case of manufacturing a semiconductor device comprising a plurality of line & space patterns, which have low aspect ratios (e.g., 2.5 or less) and the same heights, but which are different in half pitch, the line & space patterns having the half pitch not higher than a certain value (e.g., 20 nm) are formed by the pattern forming method of the embodiment.

FIG. 20 schematically shows a coating apparatus according to an embodiment for forming the coating film of the first or second embodiment by spiral coating method.

The coating apparatus of the present embodiment comprises a stage 202 configured to place the substrate 1 thereon and having an electrostatic chuck mechanism 201 for holding the substrate 1, and a rotating mechanism 203 configured to rotate the substrate 1 that is hold by the electrostatic chuck mechanism 201 and is placed on the stage 202. The rotating mechanism 203 comprises a rotation axis fixed to the stage 202 and a motor mechanism 203b for rotating the rotation axis 203a.

The coating apparatus of the embodiment further comprises a discharge mechanism 204 which includes a nozzle 204a for discharging coating solution toward the substrate 1 held by the electrostatic chuck mechanism 201 and placed on the stage 202. The discharge mechanism 204 further includes a tank 204b that accumulates coating solution, a supply tube 204c that connects the tank 204b and the nozzle 204a to supply coating solution in the tank 204b to the nozzle 204a, and a flow regulating valve (not shown) of the solution.

The coating apparatus of the present embodiment further comprises a movement mechanism 205 for moving the nozzle 204a in the radial direction of the substrate 1 held by the electrostatic chuck mechanism 201 and placed on the stage 202. The movement mechanism 205 includes an arm module 205a connected to the nozzle 204a, and a drive module 205 for moving the arm module 205a in the radial direction of the substrate 1.

The coating apparatus of the embodiment further comprises a control mechanism 206 for controlling the rotating mechanism 203, discharge mechanism 204, and movement mechanism 205.

Here, a the control mechanism 206 is configured to control at least one of spin speed of the substrate 1 rotated by the rotating mechanism 203, amount of coating solution discharged from the discharge mechanism 204, and moving speed of the nozzle 204a moved by the movement mechanism 205 in accordance with the position of the nozzle 204a on the substrate 1 to form a coating film having a desired thickness distribution on the substrate 1 by rotating the substrate 1 held by the electrostatic chuck mechanism 201 and placed on the stage 202 while the nozzle 204a is moved in the radial direction of the substrate 1.

In the above embodiment, the thickness distribution is selected so as to cancel the distribution of thickness decrement of the coating film 4 caused by the thinning the coating film 4 (distribution A) when the coating film 4 is formed on the substrate in a manner that the resist pattern 3 is covered by the coating film 4. However, the thickness distribution may be selected so as to further cancel the distribution of thickness decrement of the coating film 4 caused by the removal of the resist pattern 3 (distribution B) (canceling distributions A and B). In this case, one of distribution A and distribution B may be cancelled preferentially and the other may not be cancelled completely.

In addition, the thickness distribution may be selected so as to cancel the distribution of thickness decrement of the coating film 4 caused by etching the substrate by using the coating film pattern 4 as a mask (distribution C) in addition to cancel the distribution A (canceling distributions A and C).

Moreover, the thickness distribution of the coating film 4 may be selected so as to cancel distribution A, distribution B, and distribution C. In this case, at least one of distribution A, distribution B, and distribution C may be cancelled preferentially and the remaining ones may not be cancelled completely.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
    forming a resist pattern on a substrate, the resist pattern having a top surface;
    forming a coating film on the substrate, the coating film being configured to cover the resist pattern, and the coating film having a first thickness distribution;
    thinning the coating film to expose the top surface of the resist pattern, while the first thickness distribution is being changed into a second thickness distribution by the thinning wherein the second thickness distribution is more uniform than the first thickness distribution;
    removing the resist pattern without removing the coating film; and
    forming a coating film pattern in the substrate by processing the substrate by using the coating film after removing the resist pattern as a mask.

2. The pattern forming method of claim 1, wherein forming the coating film comprises selecting the first thickness distribution of the coating film such that a distribution of thickness decrement of the coating film caused by thinning the coating film is compensated by the first thickness distribution of the coating film.

3. The pattern forming method of claim 1, wherein the substrate comprises a semiconductor substrate and a workpiece film formed on the semiconductor substrate, and wherein the forming a resist pattern comprises forming a device pattern including the workpiece film by etching the workpiece film using the coating film pattern as a mask.

4. The pattern forming method of claim 3, wherein the workpiece film is a semiconductor film.

5. The pattern forming method of claim 3, wherein the device pattern is a gate pattern.

6. The pattern forming method of claim 1, wherein the thinning the coating film is performed by using RIE (Reactive Ion Etching) process, or CMP (Chemical Mechanical Polishing) process.

7. The pattern forming method of claim 1, wherein the substrate comprises a semiconductor substrate, a first semiconductor film formed on the semiconductor substrate, an insulating film formed on the first semiconductor film, and a second semiconductor film formed on the insulating film, and
wherein the forming a resist pattern on a substrate comprises
forming a first pattern including the second semiconductor film by etching the second semiconductor film by using the coating film pattern as a mask,
forming a second pattern including the insulating film by etching the insulating film by using the first pattern as a mask, and
forming a device pattern including the first semiconductor film by etching the first semiconductor film by using the second pattern as a mask.

8. The pattern forming method of claim 7, wherein the first semiconductor film is a polycrystalline silicon film.

9. The pattern forming method of claim 7, wherein the second semiconductor film is an amorphous silicon film.

10. The pattern forming method of claim 7, wherein the second semiconductor film comprises carbon.

11. The pattern forming method of claim 7, wherein the device pattern is a gate pattern.

12. The pattern forming method of claim 1, wherein the forming a coating film is performed using a spin-coating method, and wherein the spin coating method is performed such that the coating film has the first thickness distribution by controlling at least one of the amount of coating solution discharged from a nozzle toward the substrate, and spin speed of the substrate.

13. The pattern forming method of claim 1, wherein the forming a coating film is performed using an ink-jet coating method, and wherein the spin coating method is performed such that the coating film has the first thickness distribution by controlling at least one of number of droplets on the substrate in which the droplets are discharged from a ink-jet head toward the substrate, and the amount of one droplet discharged from the ink-jet head toward the substrate.

14. The pattern forming method of claim 1, wherein the forming a coating film is performed using a scan coating method, and wherein the scan coating method is performed such that the coating film has the first thickness distribution by controlling at least one of the amount of coating solution discharged from a nozzle toward the substrate, and scan speed of the nozzle.

15. The pattern forming method of claim 1, wherein the forming a coating film is performed using a spiral coating method, and wherein the spiral coating method is performed such that the coating film has the first thickness distribution by controlling at least one of the amount of coating solution discharged from a nozzle toward the substrate, moving speed of the nozzle from a center of the substrate toward outer edge of the substrate, and spin speed of the substrate.

\* \* \* \* \*